United States Patent
Kihara

(10) Patent No.: US 9,653,142 B1
(45) Date of Patent: May 16, 2017

(54) VOLATILE SEMICONDCUTOR MEMORY DEVICE, REFRESH CONTROL CIRCUIT AND METHOD THEREOF

(71) Applicant: Powerchip Technology Corporation, Hsinchu (TW)

(72) Inventor: Yuji Kihara, Tokyo (JP)

(73) Assignee: Powerchip Technology Corporation, Hsinchu (TW)

( * ) Notice: Subject to any disclaimer, the term of this patent is extended or adjusted under 35 U.S.C. 154(b) by 0 days.

(21) Appl. No.: 15/141,842

(22) Filed: Apr. 29, 2016

(30) Foreign Application Priority Data

Feb. 22, 2016 (JP) ................................. 2016-030952

(51) Int. Cl.
*G11C 11/406* (2006.01)
*G11C 11/4091* (2006.01)

(52) U.S. Cl.
CPC .... *G11C 11/40615* (2013.01); *G11C 11/4091* (2013.01)

(58) Field of Classification Search
CPC ....................... G11C 11/40615; G11C 11/4091
See application file for complete search history.

(56) References Cited

U.S. PATENT DOCUMENTS

| 5,652,729 A * | 7/1997 | Iwata | G11C 11/406 365/149 |
| 6,714,473 B1 * | 3/2004 | Fiscus | G11C 7/04 365/185.24 |
| 7,564,274 B2 * | 7/2009 | Hughes | H03K 17/165 327/108 |
| 8,111,574 B2 * | 2/2012 | Kim | G11C 7/04 365/201 |
| 2004/0062072 A1 * | 4/2004 | Tanzawa | G11C 11/5642 365/145 |
| 2004/0208074 A1 * | 10/2004 | Schnabel | G11C 11/406 365/222 |

(Continued)

FOREIGN PATENT DOCUMENTS

| JP | H06150647 | 5/1994 |
| JP | 2006228383 | 8/2006 |

(Continued)

OTHER PUBLICATIONS

Kihara Yuji et al., "A New type SRAM Using DRAM Technology," Electronic Communications Information Society Journal, C, Electronics, J89-C(10), Oct. 1, 2006, pp. 725-734.

*Primary Examiner* — Douglas King
(74) *Attorney, Agent, or Firm* — Jianq Chyun IP Office

(57) ABSTRACT

A refresh control circuit of a volatile semiconductor memory device is provided, where the volatile semiconductor memory device includes a plurality of memory cells respectively having a select transistor and a memory element, and the refresh control circuit of the volatile semiconductor memory device includes: a first comparison part, which compares a memory voltage of the memory cell of the volatile semiconductor memory device that is different to a general-memorizing memory cell with a specified threshold voltage, and outputs a comparison result signal, and stops self refresh of the memory cell until the memory voltage is decreased to be smaller than the specified threshold voltage. The memory cell is formed in a region adjacent to an array of the general-memorizing memory cell.

7 Claims, 13 Drawing Sheets

(56) References Cited

U.S. PATENT DOCUMENTS

2008/0205163 A1 8/2008 Park et al.
2009/0323449 A1* 12/2009 Kim .................. G11C 7/04
                                                365/222
2015/0348609 A1 12/2015 Ohmaru

FOREIGN PATENT DOCUMENTS

| JP | 2008210503 | 9/2008 |
| JP | 2016006710 | 1/2016 |

* cited by examiner

VOLATILE SEMICONDCUTOR MEMORY DEVICE, REFRESH CONTROL CIRCUIT AND METHOD THEREOF

CROSS-REFERENCE TO RELATED APPLICATION

This application claims the priority benefit of Japanese application serial no. 2016-030952, filed on Feb. 22, 2016. The entirety of the above-mentioned patent application is hereby incorporated by reference herein and made a part of this specification.

BACKGROUND OF THE INVENTION

Field of the Invention

The invention relates to a refresh control circuit and a refresh control method of a volatile semiconductor memory device such as a dynamic random access memory (DRAM), etc., and a volatile semiconductor memory device.

Description of Related Art

FIG. 1 is a circuit diagram of a structure example of a memory cell MC1 of a conventional DRAM and a refresh control circuit. In FIG. 1, a refresh controller 10 and a latch type sense amplifier 11 are included, bit line BL and/BL are connected to the latch type sense amplifier 11, a general-memorizing the memory cell MC1 includes a metal oxide semiconductor (MOS) transistor Q1 and a capacitor C1. The capacitor C1 is formed by clamping an insulation film by using a pair of electrode films. A latch-type sense amplifier 11 reads a memory voltage Vsn from a drain of the MOS transistor Q1 of the memory cell MC1 through a bit line BL to perform data determination. When charges are accumulated in the capacitor C1, the MOS transistor Q1 is in a reverse bias state, and the capacitor C1 produces a leak current along a substrate direction to result in charge discharge. Therefore, in the DRAM, regarding the memory cell MC1 of each bit, the state of the memory cell MC1 has to be restored periodically, which is referred to as "refresh". In view of the refresh, to be specific, a selected word line WL and the bit line BL are used to turn on the select MOS transistor Q1, and a specified memory voltage is charged to the capacitor C1 according to data to be memorized. The refresh is, for example, executed in a time interval of 64 ms.

It is assumed that a consuming power consumed in refresh of the DRAM is the same for all of the memory cells, and a consuming current consumed in one refresh operation is fixed, in order to decrease a total consuming current consumed in the refresh operation, a refresh interval can be prolonged to decrease the number of times of the refresh operation in every unit time. However, ideally, the consuming current in self refresh is less, so that the refresh interval is controlled to be as longer as possible within an allowable range of the characteristic (for example, a pause time characteristic) of the memory cell. The pause time characteristic has temperature dependency, and in the memory cell of the DRAM, the higher a temperature is, the shorter a pause time is, and the lower the temperature is, the longer the pause time is.

For example, according to a patent literature 1, in order to decrease the consuming current in a low temperature, a self refresh period of the DRAM is varied according to the temperature dependency of the pause time characteristic. To be specific, a first current generating circuit, a second current generating circuit, a pulse signal generating circuit and a counter circuit construct a timer circuit. The first current generating circuit generates a first current I1 with a positive temperature coefficient, the second current generating circuit generates a second current I2 with a fixed value and substantially without a temperature coefficient, and the pulse signal generating circuit generates a pulse signal with a period corresponding to a sum of the first current I1 and the second current I2 (I1+I2). The counter circuit divides a frequency of the pulse signal generated by the pulse signal generating circuit to output a timer signal.

EXISTING TECHNICAL LITERATURES

Patent Literature

Patent literature 1: Japan patent publication No. 2006-228383

Non-Patent Literature

Non-patent literature 1: authored by Kihara Yuji et al., and entitled "A New type SRAM Using DRAM Technology", Electronic Communications Information Society Journal, C, Electronics, J89-C(10), pp. 725-734, Oct. 1, 2006.

Problems to be Resolved by the Invention

However, a refresh control circuit of the patent literature 1 has a following problem, i.e. the first current generating circuit, the second current generating circuit, the pulse signal generating circuit and the counter circuit have to be adopted, so that the circuit scale becomes extremely large.

As described above, the refresh of the DRAM is, for example, executed in the time interval of 64 ms, which is for example, reasonable under a high temperature above 30 degrees, and is overspec under a room temperature (a low temperature) of about 20 degrees, and the refresh period has to be properly controlled under the room temperature (the low temperature).

SUMMARY OF THE INVENTION

The invention is directed to a refresh control circuit and a refresh control method of a volatile semiconductor memory device and a volatile semiconductor memory device, by which a circuit structure more simple than that of the conventional technique is adopted to control a refresh period, so as to decrease a consuming power under a room temperature.

Technical Means for Resolve Problems

The intention provides a refresh control circuit of a volatile semiconductor memory device, where the volatile semiconductor memory device includes a plurality of memory cells respectively having a select transistor and a memory element, and the refresh control circuit of the volatile semiconductor memory device includes:

a first comparison part, comparing a memory voltage of the memory cell of the volatile semiconductor memory device that is different to a general-memorizing memory cell with a specified threshold voltage, and outputting a comparison result signal, the refresh control circuit stops self refresh of the memory cell until the memory voltage is decreased to be smaller than the specified threshold voltage.

The refresh control circuit of the volatile semiconductor memory device is characterized in that the memory cell of the volatile semiconductor memory device that is different to the general-memorizing memory cell is formed in a region adjacent to an array of the general-memorizing memory cell.

The refresh control circuit of the volatile semiconductor memory device is characterized in that the first comparison part includes:

a differential amplifier, performing differential amplifying on the memory voltage of the volatile semiconductor memory device and the specified threshold voltage; and a digital circuit, digitalizing a voltage coming from the differential amplifier to generate the comparison result signal.

The refresh control circuit of the volatile semiconductor memory device is characterized in that the differential amplifier is set to an actuating state based on a refresh signal instructing self refresh of the memory cell.

The refresh control circuit of the volatile semiconductor memory device is characterized in that the specified threshold voltage is statistically determined according to an accumulative distribution of the memory voltages of a plurality of the memory cells.

The refresh control circuit of the volatile semiconductor memory device is characterized in that the accumulative distribution of the memory voltages is measured and obtained under a worst environment state of the volatile semiconductor memory device.

The refresh control circuit of the volatile semiconductor memory device is characterized in that the specified threshold voltage is set between a power voltage of the volatile semiconductor memory device and ½ of the power voltage.

The refresh control circuit of the volatile semiconductor memory device is characterized in that the specified threshold voltage is set to ¾ of the power voltage of the volatile semiconductor memory device.

The refresh control circuit of the volatile semiconductor memory device is characterized in that the refresh control circuit further includes:

a switch part, selectively connecting the memory voltage of the general-memorizing memory cell of the volatile semiconductor memory device to a power voltage based on a specified control signal; and a second comparison part, determining whether the memory voltage of the general-memorizing memory cell of the volatile semiconductor memory device enters a specified threshold range used for determining decrease of the memory voltage, and generating the control signal when the memory voltage enters the specified threshold range, where the switch part refreshes the memory cell based on the generated control signal.

The refresh control circuit of the volatile semiconductor memory device is characterized in that the memory voltage has two values of a high level and a low level, (1) when the general-memorizing memory cell memorizes the memory voltage of the high level, the specified threshold range is smaller than a voltage lower than the power voltage, (2) when the general-memorizing memory cell memorizes the memory voltage of the low level, the specified threshold range is smaller than a ground voltage.

The refresh control circuit of the volatile semiconductor memory device is characterized in that the switch part is a thin film transistor (TFT)-type metal oxide semiconductor transistor.

The intention provides a volatile semiconductor memory device including the refresh control circuit of the volatile semiconductor memory device.

The intention provides a refresh control method of a volatile semiconductor memory device, where the volatile semiconductor memory device includes a plurality of memory cells respectively having a select transistor and a memory element, and the refresh control method of the volatile semiconductor memory device includes:

comparing a memory voltage of the memory cell of the volatile semiconductor memory device that is different to a general-memorizing memory cell with a specified threshold voltage by using a first comparison part, and outputting a comparison result signal; and stopping self refresh of the memory cell until the memory voltage is decreased to be smaller than the specified threshold voltage.

The refresh control method of the volatile semiconductor memory device is characterized in that the refresh control method further comprises:

determining whether the memory voltage of the general-memorizing memory cell of the volatile semiconductor memory device enters a specified threshold range used for determining decrease of the memory voltage by using a second comparison part, and generating a control signal when the memory voltage enters the specified threshold range; and refreshing the memory cell based on the generated control signal by using a switch part, the switch part selectively connects the memory voltage of the general-memorizing memory cell of the volatile semiconductor memory device to a power voltage based on the control signal.

Effects of the Invention

According to the refresh control circuit and the refresh control method of the volatile semiconductor memory device of the present invention, a circuit structure more simple than that of the conventional technique is adopted to control a refresh period, so as to decrease a consuming power under a room temperature.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
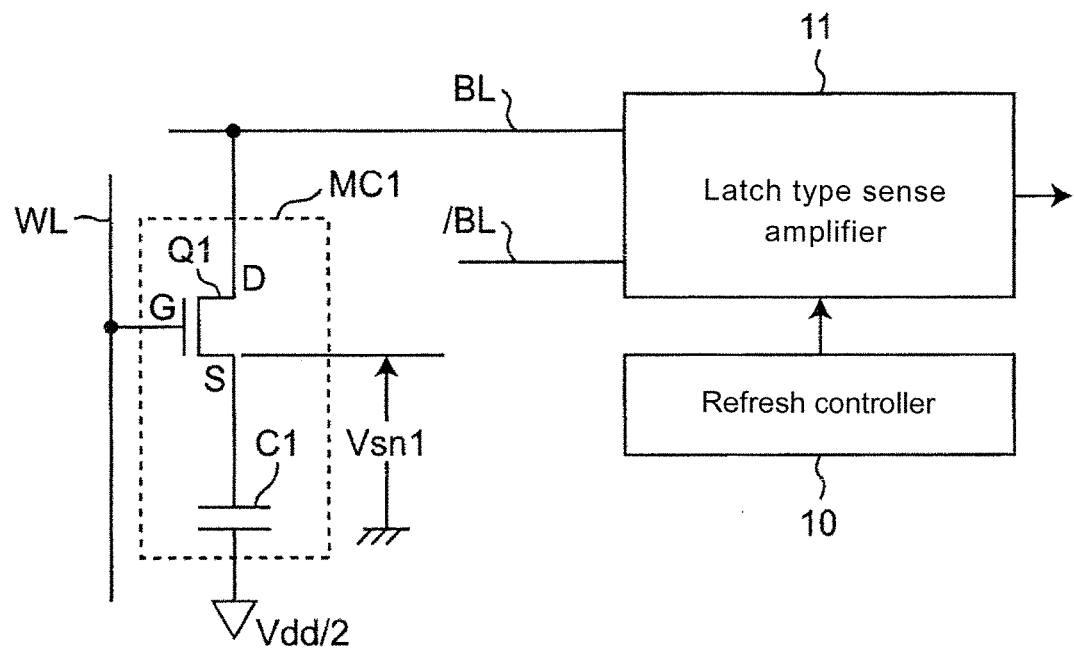
FIG. 1 is a circuit diagram of a structure example of a memory cell MC1 of a conventional DRAM and a refresh control circuit.

Reference will now be made in detail to the present preferred embodiments of the invention, examples of which are illustrated in the accompanying drawings. Wherever possible, the same reference numbers are used in the drawings and the description to refer to the same or like parts.

Embodiment 1

Figure 2:
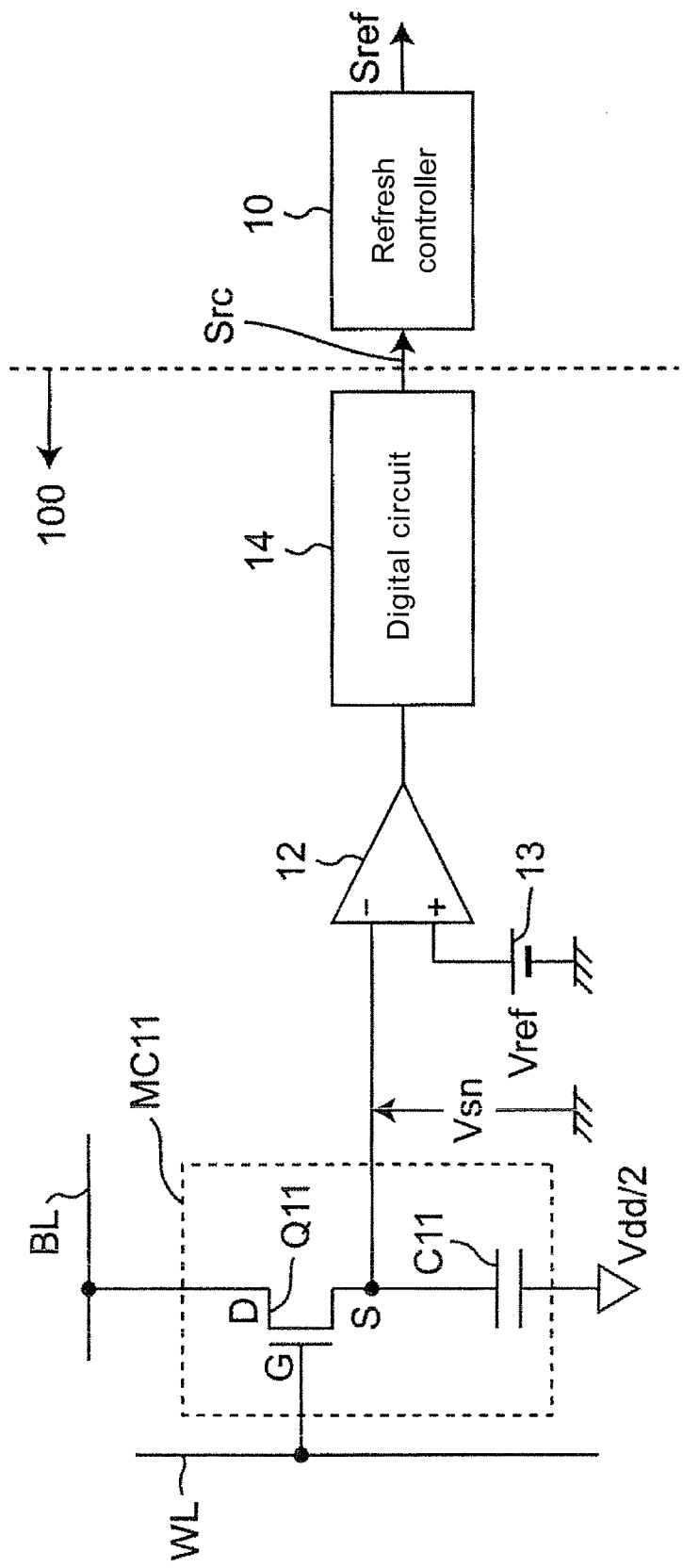
FIG. 2 is a circuit diagram of a structure example of a level-determination memory cell MC11 different to the memory cell MC1 of the DRAM and a refresh control circuit according to the embodiment 1 of the invention.
Figure 3:
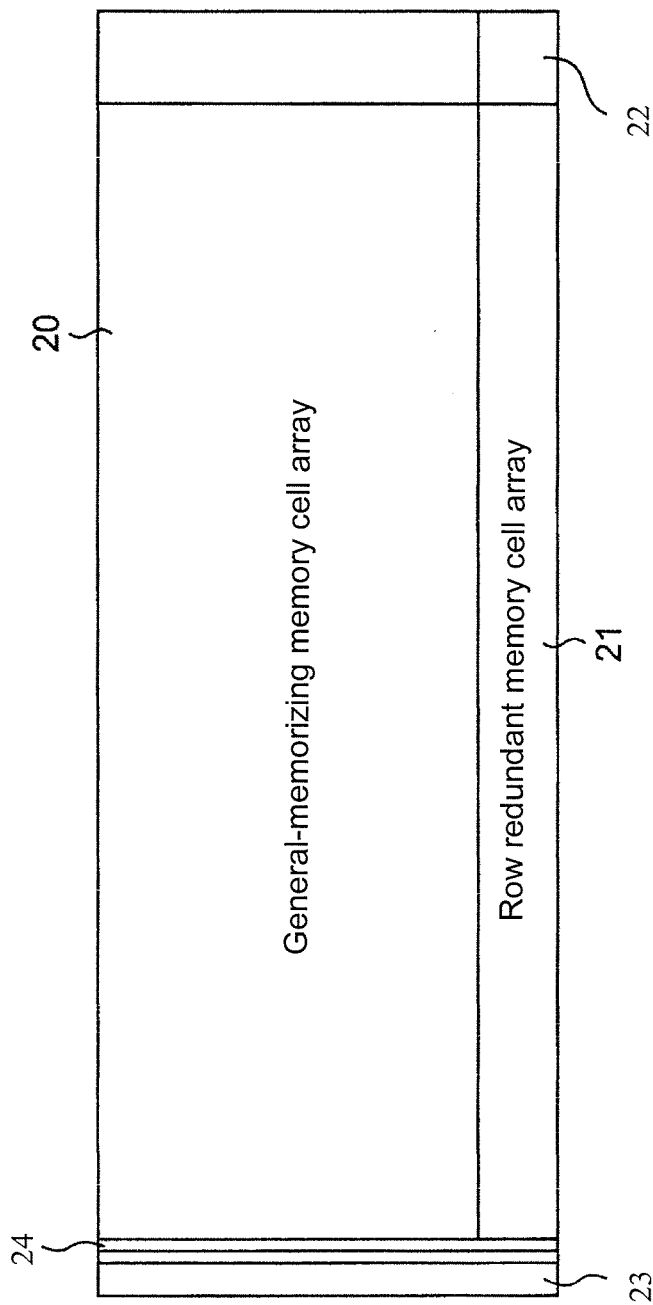
FIG. 3 is a planar diagram of a layout of a DRAM using the refresh control circuit of FIG. 2.

FIG. 2 is a circuit diagram of a structure example of a level-determination memory cell MC11 different to the memory cell MC1 of the DRAM and a refresh control circuit according to the embodiment 1 of the invention, FIG. 3 is a planar diagram of a layout of the DRAM using the refresh control circuit of FIG. 2. The refresh control circuit of FIG. 2 is characterized in that a region of a leak-monitoring memory cell array 24 (which is located near a general-memorizing memory cell array 20 and a temperature thereof can be monitored) includes level-determination memory cells MC11 different to the memory cell MC1 of the DRAM, and the refresh control circuit has a memory voltage monitoring circuit 100, where the memory voltage monitoring circuit 100 determines a memory voltage Vsn of a capacitor C11 of the memory cell MC11 and generates a refresh control signal Src based on a determination result, where the refresh control signal Src controls a refresh controller 10 to skip a self refresh.

In FIG. 2, the memory voltage monitoring circuit 100 has a memory cell MC11, a differential amplifier 12 and a digital circuit 14. The memory cell MC11 has a select MOS transistor Q11 and a capacitor C11 serving as a memory element. A drain of the MOS transistor Q11 is connected to a bit line BL, and a gate thereof is connected to a word line WL. A source of the MOS transistor Q11 is connected to a voltage source of a voltage Vdd/2 through the capacitor C11, where Vdd is a power voltage.

The memory voltage Vsn of the capacitor C11 is exerted to an inverting input terminal of the differential amplifier 12, on the other hand, a reference voltage source 13 exerts a reference voltage (a threshold voltage) Vref to a non-inverting input terminal of the differential amplifier 12. The differential amplifier 12 performs differential amplifying on the voltage exerted to the inverting input terminal according to the voltage exerted to the non-inverting input terminal, and outputs the differentially amplified voltage to the digital circuit 14. The digital circuit 14, for example, includes an inverter having a specified threshold voltage and adapted to binarize an input voltage, and compares the input voltage with the specified threshold voltage, and generates a refresh control signal Src (a comparison result signal) with a high level (1) when the input voltage is greater than the threshold voltage. On the other hand, if the input voltage is smaller than the threshold voltage, the digital circuit 14 generates the refresh control signal Src with a low level (0). The refresh control signal Src is output to the known refresh controller 10 applied in the DRAM. The refresh controller 10 adopts a known method to generate a refresh signal Sref to control the operation of the DRAM, and a following method is adopted to implement control, i.e. the self refresh is skipped (stopped) in response to the refresh control signal Src of the high level (1), and on the other hand, the self refresh is not skipped (not stopped) in response to the refresh control signal Src of the low level (0).

In the layout of FIG. 3, a semiconductor substrate of the DRAM includes following regions.

(1) a general-memorizing memory cell array 20 configured with a plurality of memory cells MC1 of FIG. 1 in a lattice shape;

(2) a row redundant memory cell array 21;

(3) a column redundant memory cell array 22;

(4) a differential amplifier array 23 having a plurality of differential amplifiers 12;

(5) a leak-monitoring memory cell array 24 configured with a plurality of memory cells MC11 of FIG. 2 in a column shape.

The leak-monitoring memory cell array 24 is configured near a whole end portion of the DRAM and located adjacent to the general-memorizing memory cell array 20, and is formed at a position suitable for monitoring a temperature of the general-memorizing memory cells MC1. Moreover, the differential amplifier array 23 is configured near the leak-monitoring memory cell array 24. A plurality of leak-monitoring memory cells can be configured to cope with a leak deviation of leak-monitoring. Dozens of sets of the leak-monitoring memory cells can be set to cope with the leak deviation of leak-monitoring, though an exact amount thereof is determined based on a process deviation.

Figure 4A:
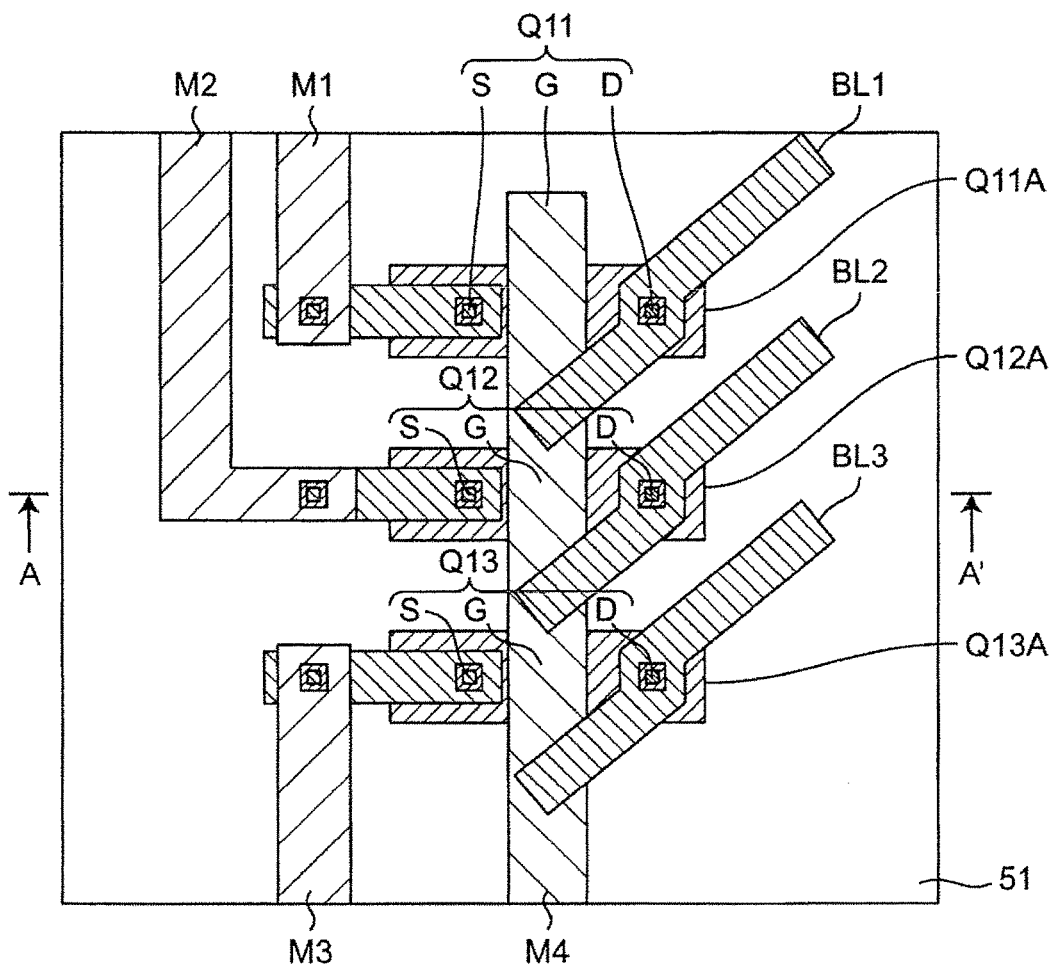
FIG. 4A is a planar diagram of a layout near the level-determination memory cell MC11 of FIG. 2.
Figure 4B:
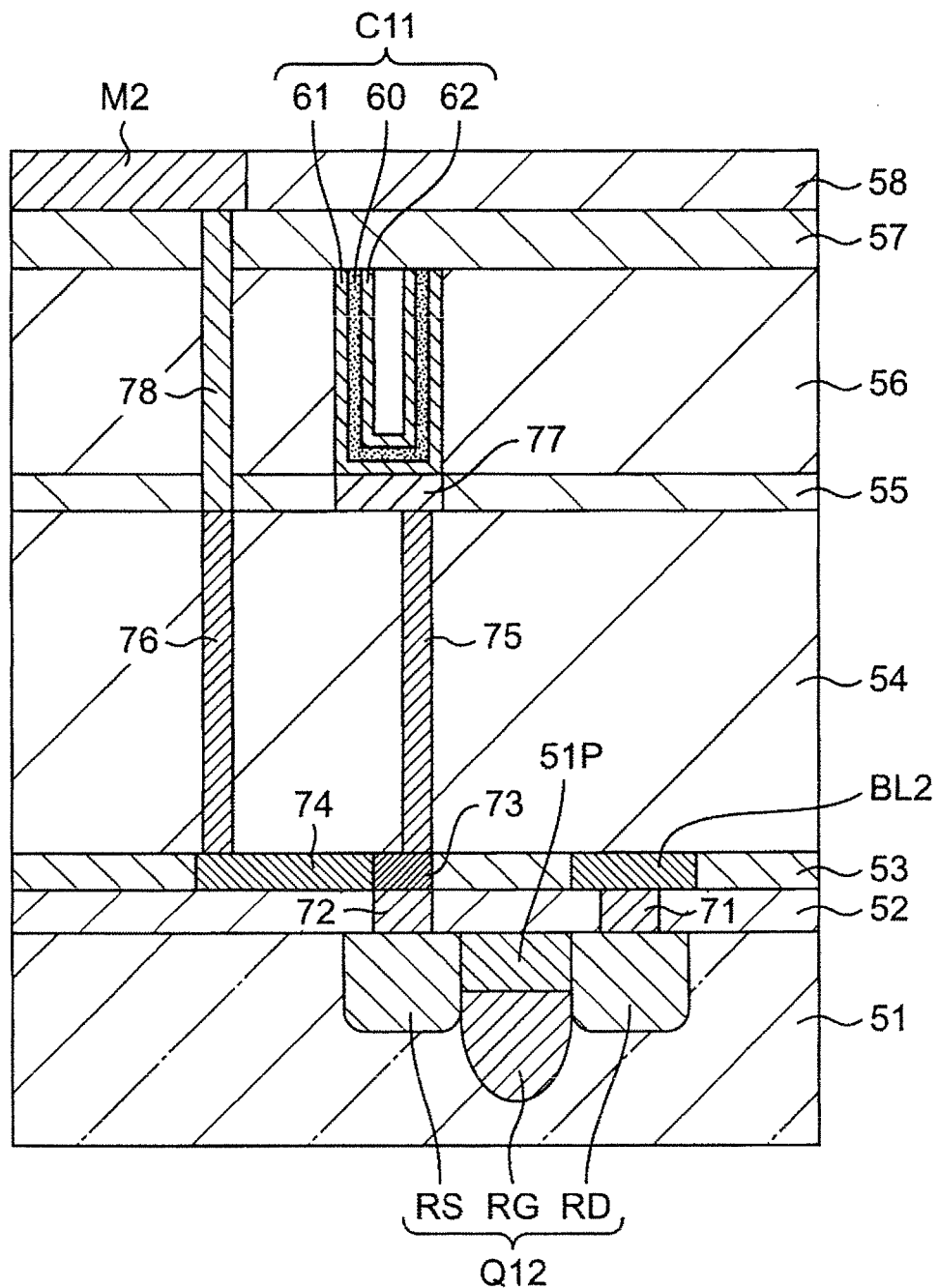
FIG. 4B is a cross-sectional view of FIG. 4A along a section line A-A'.

FIG. 4A is a planar diagram of a layout near the level-determination memory cell MC11 of FIG. 2, and FIG. 4B is a cross-sectional view of FIG. 4A along a section line A-A'.

In FIG. 4A, a plurality of MOS transistors Q11-Q13 used in the memory voltage monitoring circuit 100 is formed on a semiconductor substrate 51, and metal wires M1-M3 used for leak-monitoring are derived from each source of the MOS transistors Q11-Q13. Moreover, Q11A, Q12A, Q13A are respectively active regions of the MOS transistors Q11-Q13. M4 is a metal wire used for connecting each of the gates of the MOS transistors Q11-Q13, and BL1, BL2 and BL3 are bit lines.

In the cross-sectional view of FIG. 4B, the MOS transistor Q12 is composed of a gate region RG, a source region RS, a drain region RD and a P-well region 51P respectively formed on the semiconductor substrate 51. 52-58 are stacked insulating films, 71, 72, 75, 76, 78 are via conductors, and 73, 74, 77 are conductor films. Moreover, an insulating film 60 is clamped between electrode films 61 and 62 to form the capacitor C11.

Figure 5A:
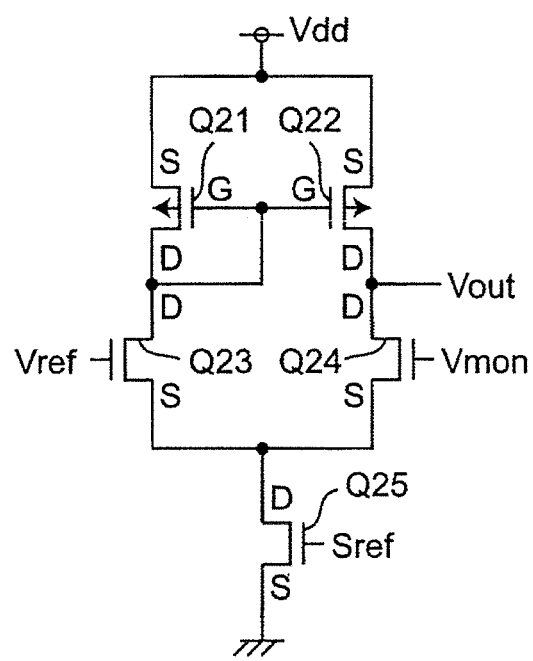
FIG. 5A is a circuit diagram of a structure example of a differential amplifier 12 of FIG. 2.

FIG. 5A is a circuit diagram of a structure example of the differential amplifier 12 of FIG. 2. In FIG. 5A, the differential amplifier 12 is composed of 5 MOS transistors Q21-Q25, where the MOS transistor Q25 is turned on in response to the refresh signal Sref with the high level coming from the refresh controller 10, so as to execute an operation of the differential amplifier 12, and the MOS transistor Q25 is turned off in response to the refresh signal Sref with the low level, so as to cut off the operation of the differential amplifier 12.

Figure 5B:
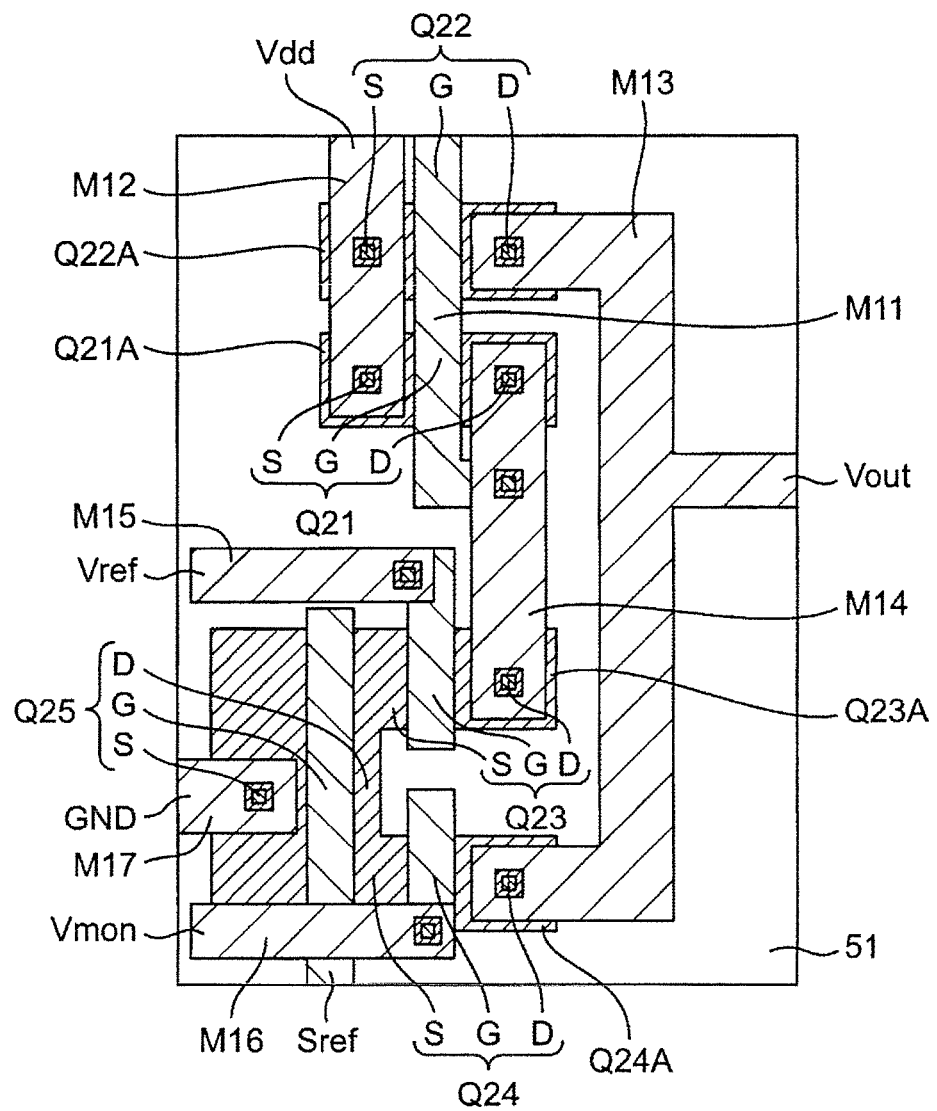
FIG. 5B is a planar diagram of a layout of the differential amplifier 12 of FIG. 5A.

FIG. 5B is a planar diagram of a layout of the differential amplifier 12 of FIG. 5A. As shown in FIG. 5B, 5 MOS transistors Q21-Q25 are formed on the semiconductor substrate 51. Q21A-Q25A are respectively active regions of the MOS transistors Q21-Q25. Moreover, a metal wire M11 connects a gate of the MOS transistor Q21 and a gate of the MOS transistor Q22. A metal wire M12 connects a source of the MOS transistor Q21 and a source of the MOS transistor Q22. A metal wire M13 connects a drain of the MOS transistor Q22 and a drain of the MOS transistor Q24, and is connected to an output terminal outputting an output voltage Vout. A metal wire M14 connects a drain of the MOS transistor Q21 and a drain of the MOS transistor Q23. A metal wire M15 connects a gate of the MOS transistor Q24 and is connected to an input terminal inputting the reference voltage Vref. A metal wire M16 connects a gate of the MOS transistor Q23 and is connected to an input terminal inputting a monitoring voltage Vmon. A metal wire M17 connects a gate of the MOS transistor Q25 and the ground.

Figure 6:
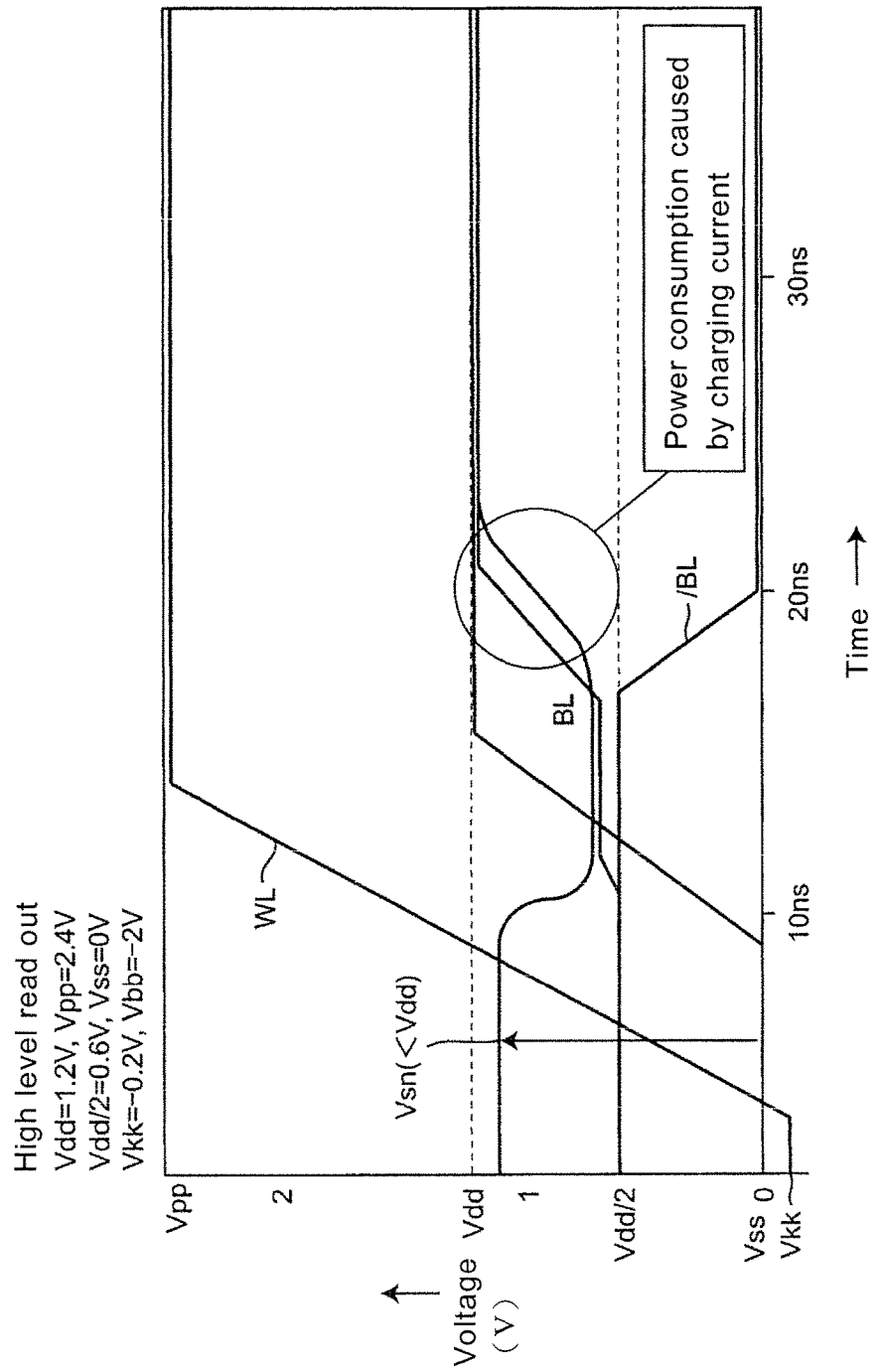
FIG. 6 is an operation timing diagram of the DRAM using the refresh control circuit of FIG. 2 when data of a high level is read from the memory cell.
Figure 7:
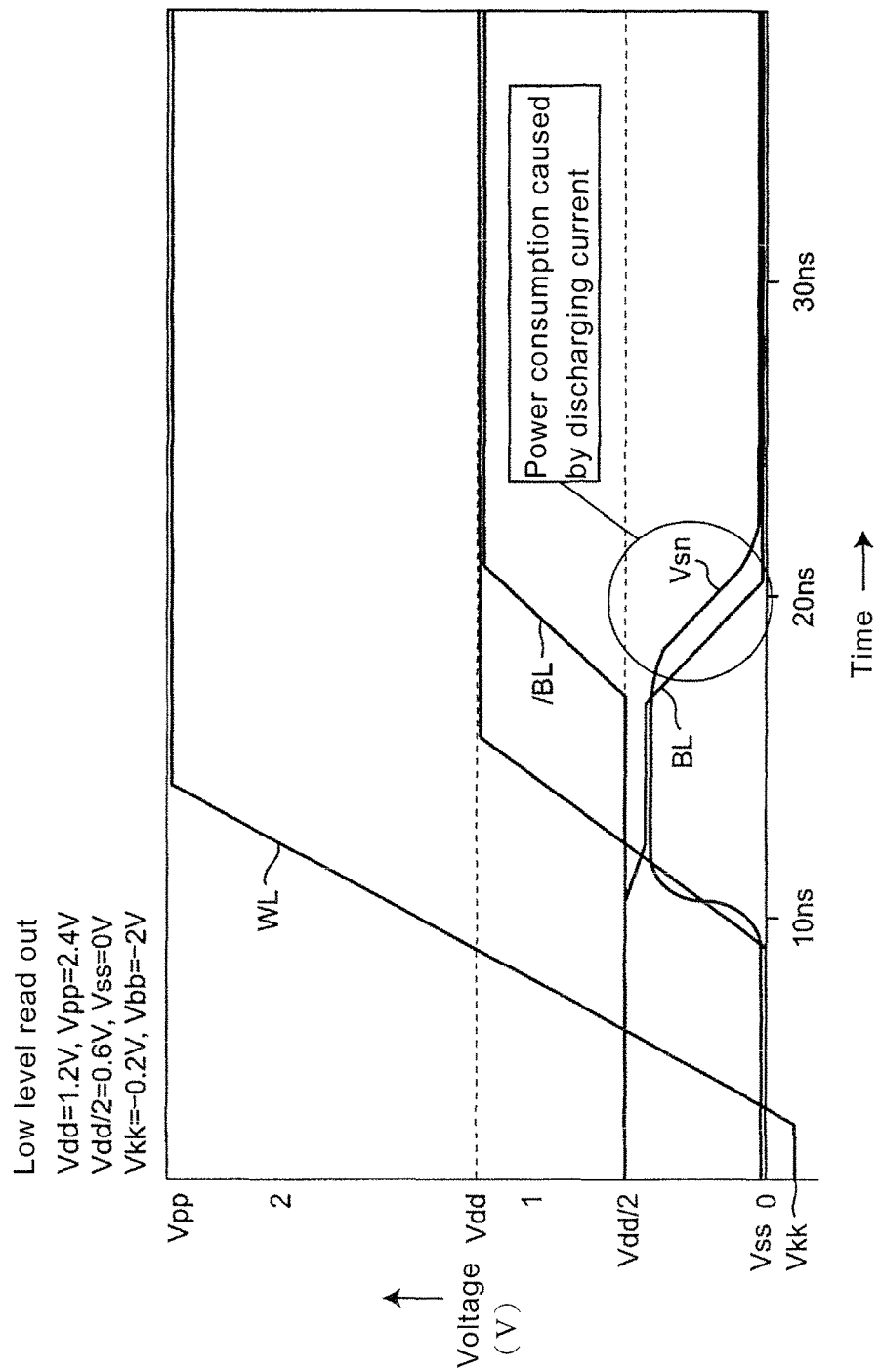
FIG. 7 is an operation timing diagram of the DRAM using the refresh control circuit of FIG. 2 when data of a low level is read from the memory cell.

FIG. 6 is an operation timing diagram of the DRAM using the refresh control circuit of FIG. 2 when data of a high level is read from the memory cell. FIG. 7 is an operation timing diagram of the DRAM using the refresh control circuit of FIG. 2 when data of a low level is read from the memory cell. In FIG. 6 and FIG. 7, Vdd is a power voltage, Vpp is a data reading high voltage, Vss is a ground voltage, Vkk is a non-select voltage of the word line WL, and Vbb is a back bias voltage of the semiconductor substrate 51.

According to FIG. 6, it is clearly known that before the refresh, the memory voltage Vsn of the high level is below the power voltage Vdd, and is decreased as time increases, though the memory voltage Vsn is increased through the refresh to implement power consumption of a charging current. A charging current of the sense amplifier is substantially smaller than a leak current of the memory. Moreover, according to FIG. 7, it is known that before the refresh, the memory voltage Vsn of the low level is decreased as time increases, so as to implement power consumption of a discharging current.

In the present embodiment, in order to mitigate the consuming power of the DRAM especially under the room temperature, the refresh control circuit of FIG. 2 is provided. The refresh control circuit of FIG. 2 is characterized in that as shown in FIG. 3, the memory cell MC11 of the leak-monitoring memory cell array 24 can be used as a temperature sensor, and the memory voltage Vsn of the memory cell MC11 in the DRAM can be used for refresh control. When the memory voltage Vsn is above the specified threshold voltage Vref, the self refresh is skipped, and the self refresh is enabled when the memory voltage Vsn is decreased to be smaller than the specified threshold voltage Vref. The specified threshold voltage Vref is determined by a static variance of the memory voltage Vsn as described later. The key point is that none special structure is required for implementation, and by using such control method, a difference between a theoretical value and an actual value of the refresh time is small. In this way, compared to the conventional mechanism, the consuming power of the DRAM can be greatly mitigated.

In the differential amplifier 12 of FIG. 5A, the operation of the differential amplifier 12 is enabled one time based on the refresh signal Sref, but then the operation thereof is cut off, so that an average value of the consuming power of the memory voltage monitoring circuit 100 containing the differential amplifier 12 is very small, and the average value is far smaller than the refresh current as shown in FIG. 6 and FIG. 7.

The layout of the memory voltage monitoring circuit 100 is shown in FIG. 4A and FIG. 4B, and the monitored memory cell is only slightly greater than the size of the general-memorizing memory cell ($6F^2$), which means a size small enough. Moreover, the differential amplifier 12 of FIG. 5A is composed of 5 MOS transistors Q21-Q25, though the influence on a die size of the DRAM is smaller than 0.01% of the gigabit class DRAM. Considering that a unit value of the die size is 10 μm, the influence can be substantially neglected.

In the DRAM of the present embodiment, redundant memory cells have to be set, and amounts and rows and columns of the redundant memory cells are determined by a characteristic of the memorized data. In the present embodiment, the amounts can be determined according to distribution of redundancy and electrical characteristics, and especially a temperature condition. The leak-monitoring memory cells MC11 are independently configured relative to the general-memorizing memory cells MC1, and the amount of the leak-monitoring memory cells MC11 is considered below in a statistical manner.

A leak level of the leak-monitoring memory cell has to be consistent with a leak level of the worst bit. It is known that in a memory integrated circuit (IC) configured with a certain level of bits (G-bit class), although the aforementioned amount of the leak-monitoring memory cells is also determined according to the configured number of bits, in statistics, considering the amount suitable for sampling, several hundred sets are required. By configuring the leak-monitoring memory cells at the end portion of the memory cell array, several hundreds of the leak-monitoring memory cells can be configured, though a chip area and the consuming current can be increased due to enlargement of the differential amplifier. As a solution, by making the value of the threshold voltage Vref to have a margin (for example, times a specified coefficient), the amount can be reduced to several dozens of sets. Now, the key is to fully evaluate the deviation.

Embodiment 2

Figure 8:
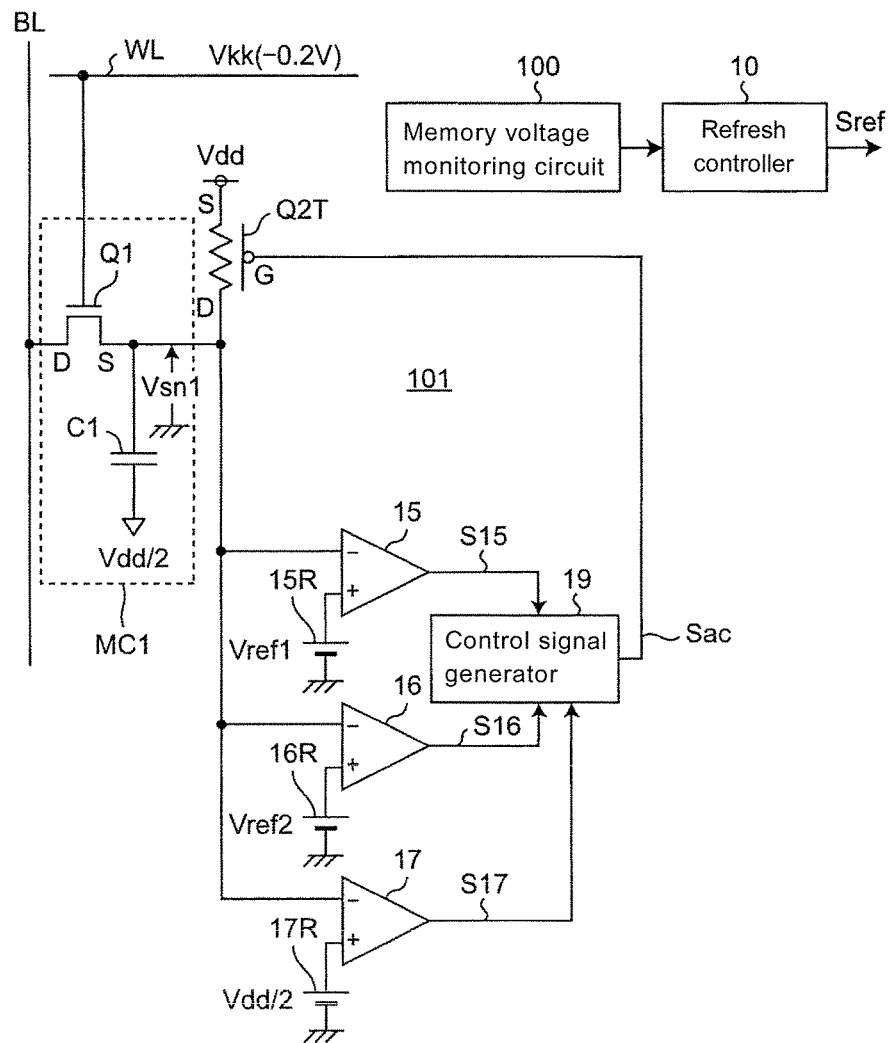
FIG. 8 is a circuit diagram of a structure example of a refresh control circuit of the memory cell MC1 applied to the DRAM according to the embodiment 2 of the invention.
Figure 9:
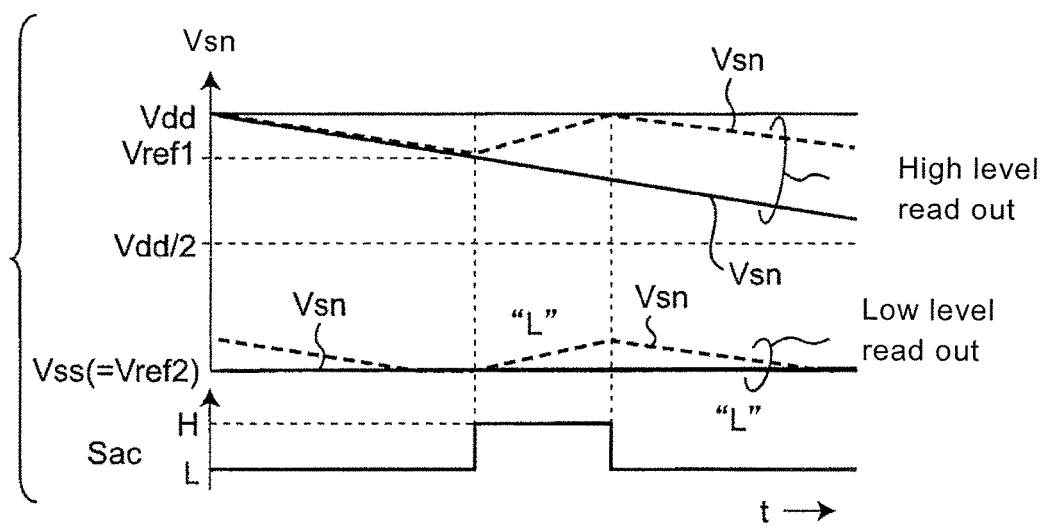
FIG. 9 is an operation timing diagram of the refresh control circuit of FIG. 8.

FIG. 8 is a circuit diagram of a structure example of the refresh control circuit of the memory cell MC1 applied to the DRAM according to the embodiment 2 of the invention. FIG. 9 is an operation timing diagram of the refresh control circuit of FIG. 8. The refresh control circuit of the embodiment 2 is characterized in that besides the memory voltage monitoring circuit 100 of the embodiment 1, the refresh control circuit further includes a refresh control circuit 101, and the refresh control circuit 101 is used for implementing a refresh time longer than that of the conventional example of FIG. 1. The refresh control circuit 101 is a refresh control circuit connected to the general-memorizing memory cell MC1, and includes a thin film transistor (TFT)-type P-channel MOS transistor Q2T disclosed in the non-patent literature 1, comparators 15, 16 and 17, reference voltage sources 15R, 16R, 17R and a control signal generator 19. The comparators 15, 16 and 17 and the control signal generator 19 construct a comparison part.

In FIG. 8, MC1 is the general-memorizing memory cell of the conventional example of FIG. 1, the TFT-type MOS transistor Q2T is connected in a following manner. A drain of the TFT-type MOS transistor Q2T is connected to a source of the MOS transistor Q1, a source of the TFT-type MOS transistor Q2T is connected to the power voltage Vdd, and a control signal Sac coming from the control signal generator 19 is applied to a gate of the TFT-type MOS transistor Q2T. A memory voltage Vsn1 of the capacitor C1 is input to inverting input terminals of the three comparators 15, 16 and 17.

The comparator 15 compares the input memory voltage Vsn1 with the threshold voltage Vref1 coming from the reference voltage source 15R, and outputs a comparison result signal S15 to the control signal generator 19. Here, the comparison result signal S15 with the high level is output when Vsn1 Vref1, and the comparison result signal S15 with the low level is output when Vsn1<Vref1. The comparator 16 compares the input memory voltage Vsn1 with the threshold voltage Vref2 coming from the reference voltage source 16R, and outputs a comparison result signal S16 to the control signal generator 19. Here, the comparison result signal S16 with the high level is output when Vsn1−Vref2, and the comparison result signal S16 with the low level is output when Vsn1<Vref2. The comparator 17 compares the input memory voltage Vsn1 with the threshold voltage Vdd/2 coming from the reference voltage source 17R, and outputs a comparison result signal S17 to the control signal generator 19. Here, the comparison result signal S17 with the high level is output when Vsn1 Vdd/2, and the comparison result signal S17 with the low level is output when Vsn1<Vdd/2.

Moreover, the threshold voltage Vref1 is set as a voltage required to be refreshed when a memory level of the memory cell MC1 is the high level and the memory voltage Vsn1 is decreased, as shown in FIG. 9, and is set as Vdd<Vref1<Vdd/2. To be specific, Vref1 is set to a value slightly higher than the power voltage Vdd. Moreover, the threshold voltage Vref2 is set as a voltage required to be refreshed when the memory level of the memory cell MC1 is the low level and the memory voltage Vsn1 is decreased, as shown in FIG. 9, for example, set as Vref2=Vss (for example, a ground voltage, or a value around Vss.

The control signal generator 19 performs determination according to following methods and generates the control signal Sac, and outputs the control signal Sac to the TFT-type MOS transistor Q2T (referring to FIG. 9).

(1) Vsn1≥Vdd/2 (the memory level of the memory cell MC1 is the high level), when Vsn1<Vref1, the control signal generator 19 generates the control signal Sac with the high level, so as to charge the capacitor C1.

(2) Vsn1≥Vdd/2 (the memory level of the memory cell MC1 is the high level), when Vsn1 Vref1, the control signal generator 19 generates the control signal Sac with the low level.

(3) Vsn1<Vdd/2 (the memory level of the memory cell MC1 is the low level), when Vsn1<Vref2, the control signal generator 19 generates the control signal Sac with the high level, so as to charge the capacitor C1.

(4) Vsn1<Vdd/2 (the memory level of the memory cell MC1 is the low level), when Vsn1≥Vref2, the control signal generator 19 generates the control signal Sac with the low level.

According to FIG. 9, it is known that in case that the memory level of the memory cell MC1 is the high level, when the memory voltage Vsn1 is decreased to the threshold voltage Vref1, the control signal generator 19 generates the control signal Sac with the high level to turn on the TFT-type MOS transistor Q2T to charge the capacitor C1, so as to increase the memory voltage Vsn1. Moreover, in case that the memory level of the memory cell MC1 is the low level, when the memory voltage Vsn1 is decreased to the threshold voltage Vref2, the control signal generator 19 generates the control signal Sac with the high level to turn on the TFT-type MOS transistor Q2T to charge the capacitor C1, so as to increase the memory voltage Vsn1. In this way, the refresh time longer than that of the conventional example of FIG. 1 is implemented.

In the above embodiment 2, the TFT-type MOS transistor Q2T is adopted, though the invention is not limited thereto, and other types of MOS transistor serving as the switch part can also be adopted. Moreover, in the embodiment 2, the refresh control circuit of the embodiment 1 is adopted, though the invention is not limited thereto, and the refresh control circuit of the embodiment 2 may independently function.

Embodiment

In the following embodiment, in case of a plurality of memory cells MC1, MC11 of the DRAM, simulation of the inventor and result thereof and voltage setting of the threshold voltage Vref in the embodiment 1 are described below.

Figure 10A:
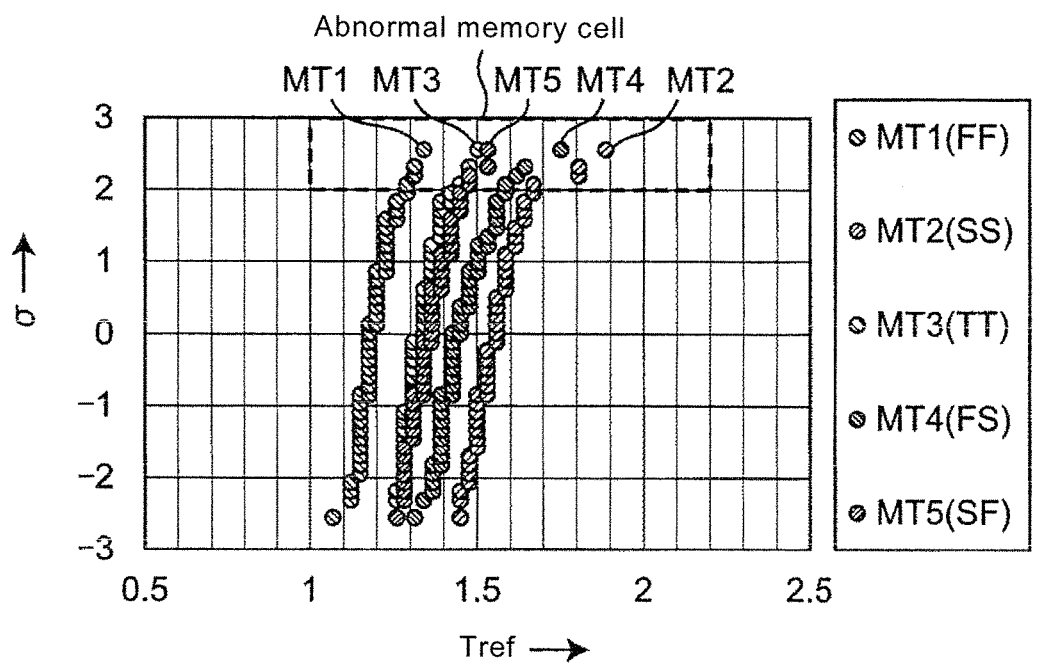
FIG. 10A is an experiment result of the embodiment 1, which illustrates an accumulative distribution of a refresh time Tref.
Figure 10B:
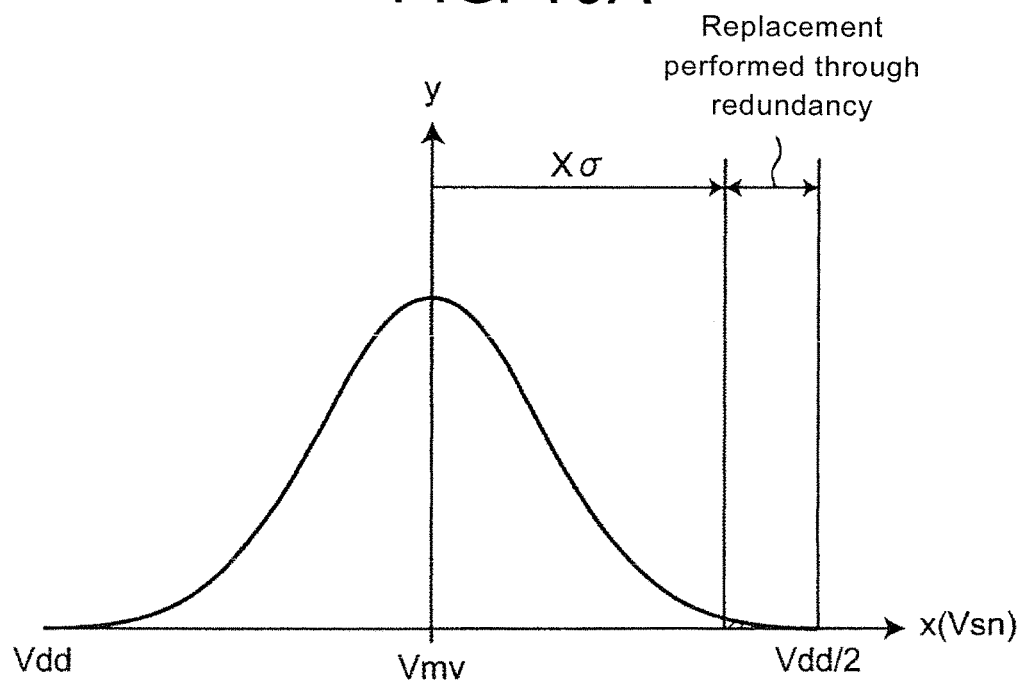
FIG. 10B illustrates a distribution (which is assumed to be a standard distribution) of a memory voltage Vsn with a high level counted after 64 ms of the refresh in case of a high temperature.
Figure 11A:
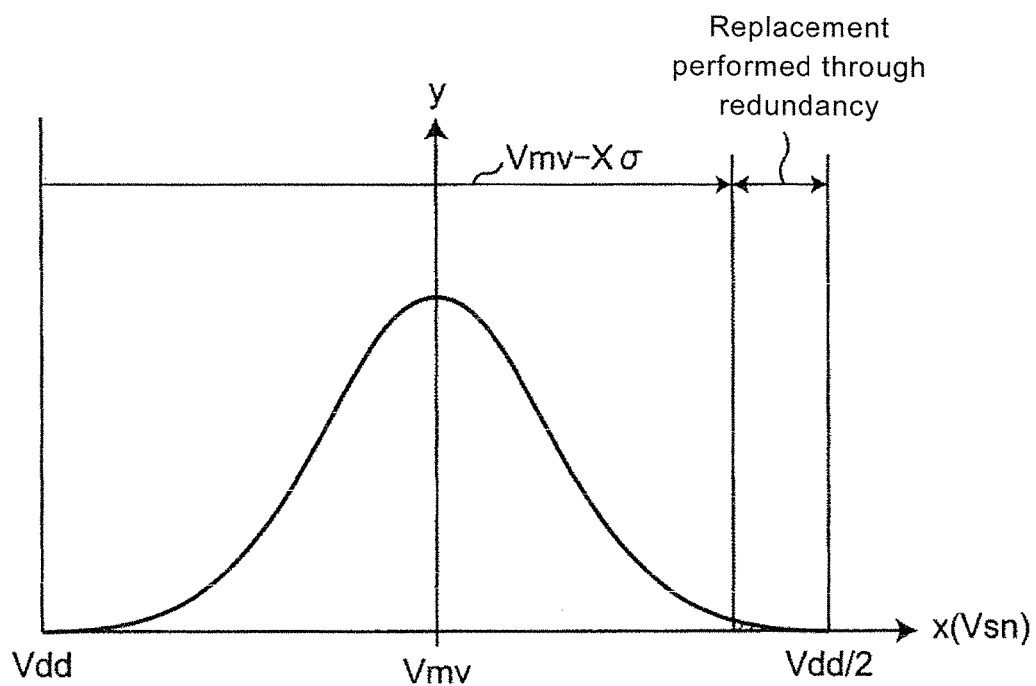
FIG. 11A illustrates a distribution (which is assumed to be a standard distribution) of the memory voltage Vsn counted after 64 ms of the refresh in case of the high temperature.
Figure 11B:
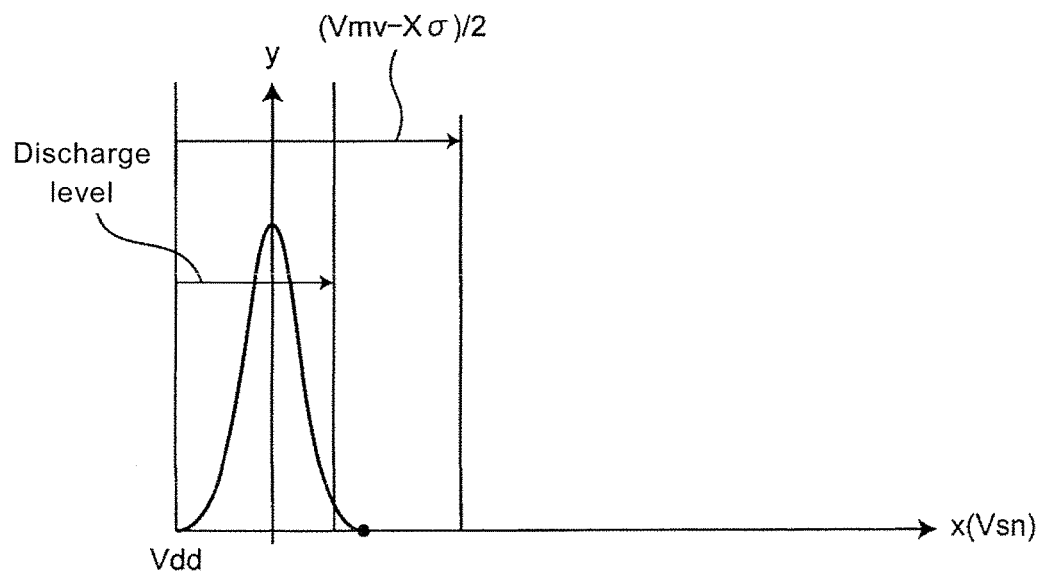
FIG. 11B illustrates a distribution (which is assumed to be a standard distribution) of the memory voltage Vsn counted after 64 ms of the refresh in case of a low temperature.

FIG. 10A is an experiment result of the embodiment 1, which illustrates an accumulative distribution of a refresh time Tref. FIG. 10B illustrates a distribution (which is assumed to be a standard distribution) of the memory voltage Vsn with the high level counted after 64 ms of the refresh in case of a high temperature. FIG. 11A illustrates a distribution (which is assumed to be a standard distribution) of the memory voltage Vsn counted after 64 ms of the refresh in case of the high temperature. FIG. 11B illustrates a distribution (which is assumed to be a standard distribution) of the memory voltage Vsn counted after 64 ms of the refresh in case of a room temperature of 20 degrees, etc., i.e. the low temperature. Moreover, FIG. 10A illustrates a simulation result of the refresh time of various model transistors MT1-MT5 of different process corners FF, SS, TT, FS and SF.

In view of design, a key issue is that experiment results are distributed according to various process conditions to obtain a required number of redundant memory cells (redundant row, redundant column), so as to design a DRAM capable of replacing all of abnormal memory cells into normal memory cells complied with the standard distribution through test before replacement or multiple replacement, etc. In such DRAM designed based on the aforementioned concept, after the redundant replacement, the refresh time of all of the memory cells can be regarded to be complied with the standard distribution. After the replacement of the redundant memory cells, a standard deviation a is obtained, and then an X value is obtained. The X value represents a reference of the worst bit existed at a certain multiple of the standard deviation. The X value is basically relevant to a value of an adopted memory capacity, which can be moderated through an effect of the redundant replacement, such that the X value becomes a value considering the above effect. Through the redundant replacement, the memory voltage Vsn with the high level in the memory cell exists between the power voltage Vdd and a voltage (Vmv−Xσ), as shown in FIG. 10B, and the worst bit is a bit of the voltage (Vmv−Xσ), where Vmv is a median value of the standard distribution. Considering the memory IC with all of the bits being complied with the standard distribution, a level status of only the worst bit is discussed.

According to FIG. 11A, it is known that in case of the high temperature, a voltage drop (Vmv−Xσ) before the refresh can be obtained according to Xσ considering the replacement of the redundant memory cell. According to FIG. 11B, it is known that in case of the low temperature such as the room temperature, etc., a distribution of the dropped voltage before the refresh is shifted to the side of the power voltage Vdd, so that as long as the voltage drop of the worst bit has a value higher than a half of the voltage (Vmv−Xσ), under the situation that one refresh is skipped, in a next refresh, the worst bit has a value higher than (Vmv−Xσ); so that the data is maintained.

In view of application in an actual device, in order to use the value of the worst bit to determine whether the refresh is skipped, the threshold voltage Vref of the differential amplifier 12 is considered to be set to (¾) Vdd.

In case of the high temperature of a poor environment state, if the threshold voltage Vref=(¾) Vdd, the memory voltage (which is equivalent to the voltage of the worst bit) of FIG. 2 is lower than the threshold voltage Vref, so that the refresh cannot be skipped.

In case of the low temperature, the memory voltage (which is equivalent to the voltage of the worst bit) of FIG. 2 is higher than the threshold voltage Vref, so that the refresh can be skipped. In view of the inspection before shipment, the memory voltage monitoring circuit 100 has to be used to execute a scan test after the refresh is skipped. In case that the DRAM has poor bits, the redundant memory cells can be used to implement replacement as shown in FIG. 11A, such that not only reliability of the DRAM is ensured, but also the refresh is properly executed.

Moreover, in the aforementioned embodiment, the threshold voltage Vref is, for example, set to (¾) Vdd, though the invention is not limited thereto, and the threshold voltage Vref can also be set to a voltage between the power voltage Vdd and Vdd/2.

In the aforementioned embodiment, the refresh control circuit of the DRAM is described, though the invention is not limited thereto, and the concept of the invention is also adapted to a refresh control circuit of a volatile semiconductor memory device other than the DRAM.

For simplicity's sake, only one of the memory cells MC1, MC11 is shown in FIG. 1, FIG. 2 and FIG. 8, though in order to construct the DRAM, a plurality of the memory cells MC1 and MC11 have to be configured.

INDUSTRIAL AVAILABILITY

As described above, according to the refresh control circuit and the refresh control method of the volatile semiconductor memory device of the invention, a circuit structure more simple than that of the conventional technique is used to control the refresh period, so as to decrease the consuming power.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A refresh control method of a volatile semiconductor memory device, wherein the volatile semiconductor memory device comprises a plurality of general-memorizing memory cells, the refresh control method of the volatile semiconductor memory device comprising:

comparing, by a first comparator, a memory voltage of the general-memorizing memory cell with a first threshold voltage and outputting a first comparison signal;

comparing, by a second comparator, the memory voltage of the general-memorizing memory cell with a second threshold voltage and outputting a second comparison signal;

comparing, by a third comparator, the memory voltage of the general-memorizing memory cell with a third threshold voltage and outputting a third comparison signal; and generating, by a control signal generator, a control signal according to the first comparison signal, the second comparison signal and the third comparison signal, and outputting the generated control signal to control a switch part of the volatile semiconductor memory device, wherein the control signal has a first logic level when the memory voltage is within a specific threshold range, the control signal has a second logic level when the memory voltage is outside the specific threshold range, and the threshold range is determined according to the first threshold voltage, the second threshold voltage and the third threshold voltage.

2. The refresh control method of the volatile semiconductor memory device as claimed in claim 1, further comprising:

refreshing the memory cell based on the generated control signal by using the switch part, the switch part selectively connects the memory voltage of the general-memorizing memory cell of the volatile semiconductor memory device to a power voltage based on the control signal.

3. The refresh control method of the volatile semiconductor memory device as claimed in claim 1, wherein the specific threshold range is used to determine a decrease of the memory voltage of the general-memorizing memory cell.

4. The refresh control method of the volatile semiconductor memory device as claimed in claim 3, wherein the control signal has the first logic value when the memory voltage is greater than or equal to the third threshold voltage and the memory voltage is smaller than the first threshold voltage or when the memory voltage is smaller than the third threshold voltage and the memory voltage is smaller than the second threshold voltage, and the control signal has the second logic value when the memory voltage is greater than or equal to the third threshold voltage and the memory voltage is greater than or equal to the first threshold voltage or when the memory voltage is smaller than the third threshold voltage and the memory voltage is greater than or equal to the second threshold voltage.

5. A refresh control circuit of a volatile semiconductor memory device, wherein the volatile semiconductor memory device comprises a plurality of general-memorizing memory cells, the refresh control circuit of the volatile semiconductor memory device comprising:

a first comparator, comparing a memory voltage of the general-memorizing memory cell with a first threshold voltage and outputting a first comparison signal;

a second comparator, comparing the memory voltage of the general-memorizing memory cell with a second threshold voltage and outputting a second comparison signal;

a third comparator, comparing the memory voltage of the general-memorizing memory cell with a third threshold voltage and outputting a third comparison signal;

a control signal generator, receiving the first comparison signal, the second comparison signal and the third comparison signal, generating a control signal according to the first comparison signal, the second comparison signal and the third comparison signal; and a switch part, used to refresh the memory cell based on the generated control signal, wherein the control signal has a first logic level when the memory voltage is within a specific threshold range, the control signal has a second logic level when the memory voltage is outside the specific threshold range, and the threshold range is determined according to the first threshold voltage, the second threshold voltage and the third threshold voltage.

6. The refresh control circuit of the volatile semiconductor memory device as claimed in claim 5, wherein the specific threshold range is used to determine a decrease of the memory voltage of the general-memorizing memory cell.

7. The refresh control circuit of the volatile semiconductor memory device as claimed in claim 6, wherein the control signal has the first logic value when the memory voltage is greater than or equal to the third threshold voltage and the memory voltage is smaller than the first threshold voltage or when the memory voltage is smaller than the third threshold voltage and the memory voltage is smaller than the second threshold voltage, and the control signal has the second logic value when the memory voltage is greater than or equal to the third threshold voltage and the memory voltage is greater than or equal to the first threshold voltage or when the memory voltage is smaller than the third threshold voltage and the memory voltage is greater than or equal to the second threshold voltage.

* * * * *